United States Patent
Li et al.

(10) Patent No.: US 7,944,247 B2
(45) Date of Patent: May 17, 2011

(54) OPERATING CIRCUIT

(75) Inventors: Kun-Hsien Li, Taipei County (TW); Chih-Pin Sun, Hsinchu County (TW); Hao-Ping Hong, Hsinchu County (TW); Yung-Yu Lin, Taipei County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 5 days.

(21) Appl. No.: 12/417,641

(22) Filed: Apr. 3, 2009

(65) Prior Publication Data
US 2009/0251191 A1 Oct. 8, 2009

Related U.S. Application Data

(60) Provisional application No. 61/043,134, filed on Apr. 8, 2008.

(51) Int. Cl.
*H03K 5/22* (2006.01)
(52) U.S. Cl. ............. 327/65; 327/67; 327/312; 327/321
(58) Field of Classification Search ............... 327/63–65, 327/67, 309, 312, 313, 321, 327
See application file for complete search history.

(56) References Cited

U.S. PATENT DOCUMENTS

| | | | |
|---|---|---|---|
| 4,940,907 A | 7/1990 | Laude | |
| 5,289,054 A | 2/1994 | Lucas | |
| 5,448,200 A | 9/1995 | Fernandez et al. | |
| 5,994,939 A * | 11/1999 | Johnson et al. | 327/280 |
| 7,173,489 B1 * | 2/2007 | Song et al. | 330/254 |
| 7,579,881 B2 * | 8/2009 | Bach | 327/108 |
| 7,675,363 B2 * | 3/2010 | Deguchi et al. | 330/254 |

* cited by examiner

*Primary Examiner* — Long Nguyen
(74) *Attorney, Agent, or Firm* — Winston Hsu; Scott Margo

(57) ABSTRACT

An operating circuit includes a differential amplifier stage, which has a first input node for receiving a first input signal of a differential input, a second input node for receiving a second input signal of the differential input, a first output node for outputting a first output signal of a differential output, and a second output node for outputting a second output signal of the differential output; an offset current stage coupled to the first output node and the second output node for inducing a first offset current at the first output node and a second offset current at the second output node; and a first clamping device coupled to the first output node for selectively clamping an output voltage at the first output node according to the first output signal at the first output node.

9 Claims, 5 Drawing Sheets

US 7,944,247 B2

OPERATING CIRCUIT

CROSS REFERENCE TO RELATED APPLICATIONS

This application claims the benefit of U.S. provisional application No. 61/043,134, which was filed on Aug. 4, 2008 and is included herein by reference.

BACKGROUND

The present invention relates to an operating circuit, and more particularly, to a squelch circuit that utilizes a clamping device to increase the operating speed of the squelch circuit.

Please refer to FIG. 1. FIG. 1 is a diagram illustrating a prior art squelch circuit 100 of. The squelch circuit 100 comprises a first input circuit 104, a first comparator 108, an inverter 110, a second input circuit 112, a second comparator 116, an inverter 118, and a de-glitch circuit 120. The squelch circuit 100 is utilized for detecting a differential voltage level of the eye diagram of a differential signal (i.e., $VIN_+$, $VIN_-$ as shown in FIG. 1) inputted to the level shift circuit 102 and generating a detected output SQOUT. The differential signal $VIN_+$, $VIN_-$ is transmitted into two signal paths, the first signal path is comprises of the first input circuit 104, the first comparator 108, and the inverter 110, while the second signal path is comprises of the second input circuit 112, the second comparator 116, and the inverter 118, wherein the differential signal $VIN_+$, $VIN_-$ that transmitted into the first path is inversed to the differential signal $VIN_+$, $VIN_-$ that transmitted into the second path.

According to the specification of the USB (Universal Serial Bus), the minimum voltage level that required by the USB receiver is 100 mV, thus the squelch threshold is set about 125 mV normally. Therefore, the first signal path is responsible for detecting if the voltage difference of $VIN_+-VIN_-$ is smaller than –125 mV, and the second signal path is responsible for detecting if the voltage difference of $VIN_+-VIN_-$ is larger than 125 mV. If the voltage difference of $VIN_+-VIN_-$ is smaller than –125 mV, then an output OUT1 of the first comparator 108 is a high voltage signal; if the voltage difference of $VIN_+-VIN_-$ is larger than 125 mV, then an output OUT2 of the second comparator 108 is a low voltage signal. Thus, after the de-glitch circuit 120, if the voltage difference of each eye diagram of the differential signal $VIN_+$, $VIN_-$ is larger than the squelch threshold 125 mV, the detected output SQOUT will be always a high voltage; if the voltage difference of a specific eye diagram of the differential signal $VIN_+$, $VIN_-$ is lower than 125 mV, the de-glitch circuit 120 will output a low voltage that corresponding to the specific eye diagram of the differential signal $VIN_+$, $VIN_-$. However, due to the parasitic resistor and capacitor at the output nodes of the first stage one circuit 104 and the second input circuit 112, the signal swing at the output nodes of the first input circuit 104 and the second input circuit 112 may not reach to the designed target within a specific time interval. On the other hand, the operating speed of the first input circuit 104 and the second input circuit 112 may limit the detecting speed of the squelch circuit 100. Therefore, increasing the operating speed of the first input circuit 104 and the second input circuit 112 is becoming a critical technique in the field of high speed USB devices.

SUMMARY OF THE INVENTION

Therefore, one of the objectives of the present invention provides a squelch circuit that utilizes a clamping device to increase the operating speed of the squelch circuit.

According to an embodiment of the present invention, an operating circuit is disclosed. The operating circuit comprises a differential amplifier stage, an offset current stage, and a clamping device. The differential amplifier stage amplifies a differential input to generate a differential output, the differential amplifier stage has a first input node for receiving a first input signal of the differential input, a second input node for receiving a second input signal of the differential input, a first output node for outputting a first output signal of the differential output, and a second output node for outputting a second output signal of the differential output. The offset current stage coupled to the first output node and the second output node for inducing a first offset current at the first output node and a second offset current at the second output node, wherein a current value of the first offset current is different from a current value of the second offset current. The clamping device coupled to the first output node for selectively clamping an output voltage at the first output node according to the first output signal at the first output node.

According to an embodiment of the present invention, an operating circuit is disclosed. The operating circuit comprises a differential amplifier stage, an offset current stage, and a clamping transistor. The differential amplifier stage amplifies a differential input to generate a differential output, the differential amplifier stage has a first input node for receiving a first input signal of the differential input, a second input node for receiving a second input signal of the differential input, a first output node for outputting a first output signal of the differential output, and a second output node for outputting a second output signal of the differential output. The offset current stage is coupled to the first output node and the second output node for inducing a first offset current at the first output node and a second offset current at the second output node, wherein a current value of the first offset current is different from a current value of the second offset current. The clamping transistor has a control node coupled to a bias voltage, a first node coupled to the first output node, and a second node coupled to the second output node. The clamping transistor selectively clamps output voltages at the first output node and the second output node according to the first output signal at the first output node and the second output signal at the second output node, wherein only one clamping transistor is coupled between the first output node and the second output node.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
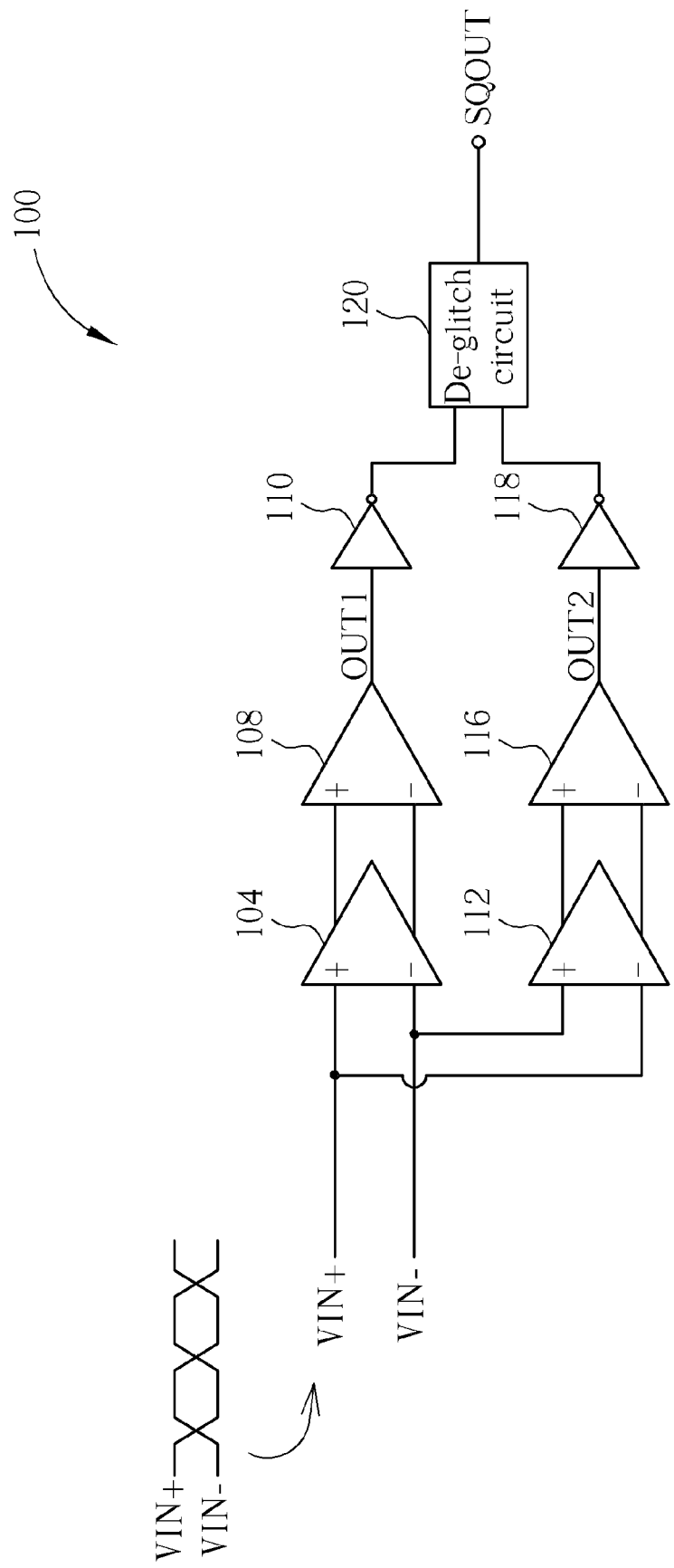
FIG. 1 is a diagram illustrating a squelch circuit of a prior art.
Figure 2:
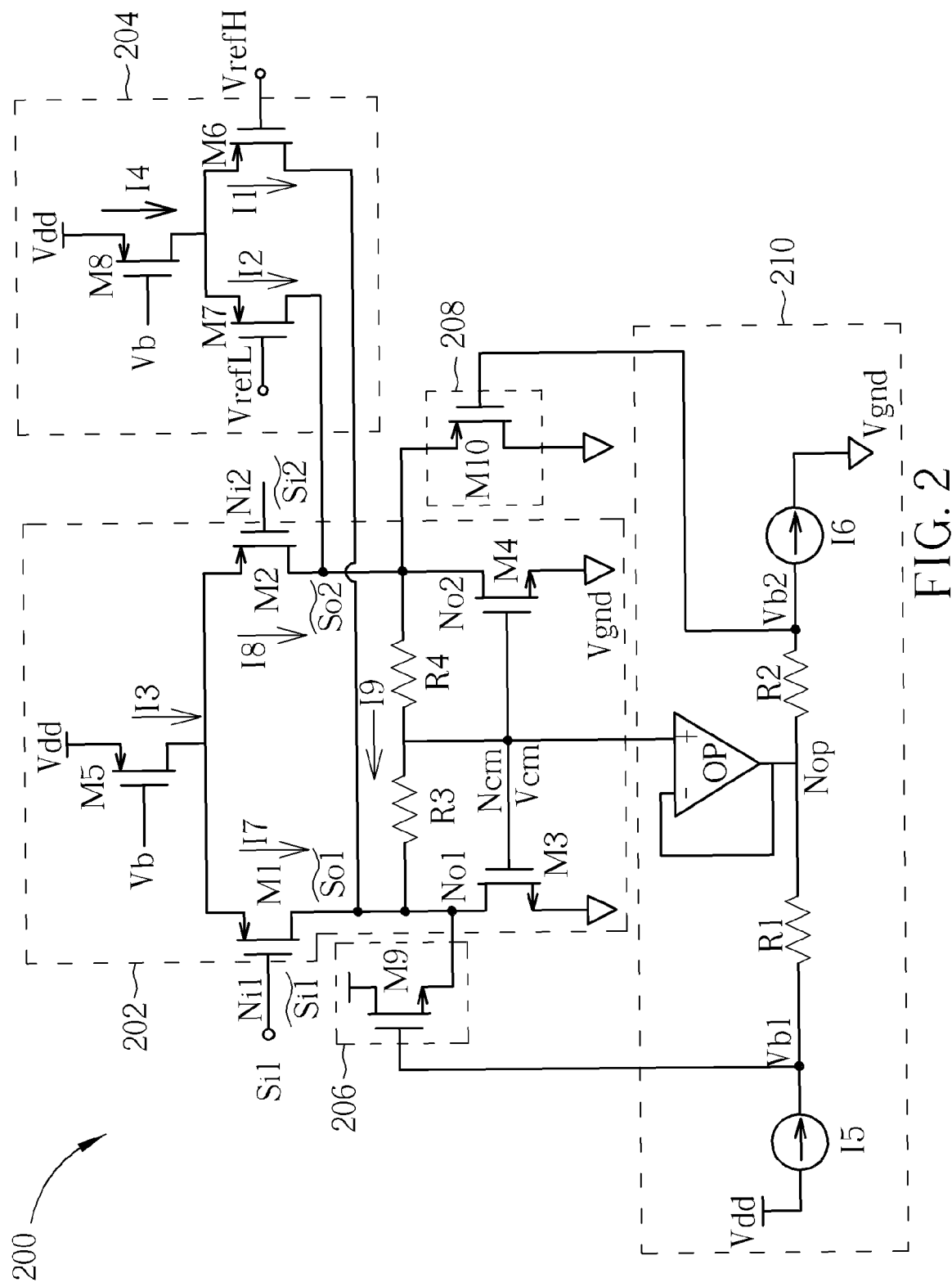
FIG. 2 is a diagram illustrating an operating circuit according to an embodiment of the present invention.

Please refer to FIG. 2. FIG. 2 is a diagram illustrating an operating circuit 200 according to an embodiment of the present invention. The operating circuit 200 comprises a differential amplifier stage 202, an offset current stage 204, a first clamping device 206, a second clamping device 208, and a bias voltage generator 210. The differential amplifier stage 202 is utilized for amplifying a differential input to generate a differential output, the differential amplifier stage 202 has a first input node Ni1 for receiving a first input signal Si1 of the differential input, a second input node Ni2 for receiving a second input signal Si2 of the differential input, a first output node No1 for outputting a first output signal So1 of the differential output, and a second output node No2 for outputting a second output signal So2 of the differential output. The offset current stage 204 coupled to the first output node So1 and the second output node So2 for inducing a first offset current I1 at the first output node No1 and a second offset current I2 at the second output node No2, wherein a current value of the first offset current I1 is different from a current value of the second offset current I2. The first clamping device 206 is coupled to the first output node No1 for selectively clamping an output voltage at the first output node No1 according to the first output signal So1 at the first output node No1. The second clamping device 208 is coupled to the second output node No2 for selectively clamping an output voltage at the second output node No2 according to the second output signal So2 at the second output node No2. Furthermore, the bias voltage generator 210 generates a first bias voltage Vb1 and a second bias voltage Vb2 for the first clamping device 206 and the second clamping device 208, respectively, according to a common mode voltage VCM of the first output signal So1 and the second output signal So2.

According to the embodiment of the present invention as shown in FIG. 2, the differential amplifier stage 202 comprises a differential input pair, i.e., PMOS transistors M1, M2, cascoded with a diode-connected loading circuit, i.e., NMOS transistors M3, M4, and resistors R3, R4. Furthermore, a PMOS transistor M5 is utilized for generating an operating current I3 for the differential input pair, in which a source node coupled to a supply voltage Vdd, a gate node coupled to a bias voltage Vb, and a drain node coupled to the differential input pair. The offset current stage 204 comprises a PMOS transistor M6 and a PMOS transistor M7 configured as another differential pair for generating the first offset current I1 and the second offset current I2, respectively, in which a bias voltage VrefH coupled to a gate node of the PMOS transistor M6 and a bias voltage VrefL coupled to a gate node of the PMOS transistor M7. Similarly, a PMOS transistor M8 is utilized for generating an operating current I4 for the differential pair, in which a source node coupled to a supply voltage Vdd, a gate node coupled to the bias voltage Vb, and a drain node coupled to the differential pair. In addition, the first clamping device 206 comprises a NMOS transistor M9 having a gate node coupled to the first bias voltage Vb1, a source node coupled to the first output node No1, and a drain node coupled to the supply voltage Vdd; and the second clamping device 208 comprises a PMOS transistor M10 having a gate node coupled to the second bias voltage Vb2, a source node coupled to the second output node No2, and a drain node coupled to a ground voltage Vgnd.

On the other hand, the bias voltage generator 210 comprises an operating amplifier OP, having a positive input node coupled to a common mode voltage node Ncm of the diode-connected loading circuit, a negative input node coupled to an output node Nop of the operating amplifier OP; a resistor R1, having a first node coupled to the output node Nop of the operating amplifier OP, and a second node coupled to the gate node of the NMOS transistor M9 and a reference current I5; and a resistor R2, having a first node coupled to the output node Nop of the operating amplifier OP, and a second node coupled to the gate node of the PMOS transistor M10 and a reference current I6. Please note that, according to the embodiment of the present invention, the resistances of the resistor R3 and R4 are set to be the same for brevity, but this is not a limitation of the present invention. Furthermore, in order to describe the spirit of the present invention more clearly, the bias voltage VrefH and the bias voltage VrefL are bias at 825 mH and 700 mH respectively, while the PMOS transistors M1, M2, M6, M7 are set to the same size (i.e., W/L), and the size of PMOS transistor M5 is equal to the size of PMOS transistor M8. Please note that, the above-mentioned setting is not being the limitation of the present invention too.

Figure 3:
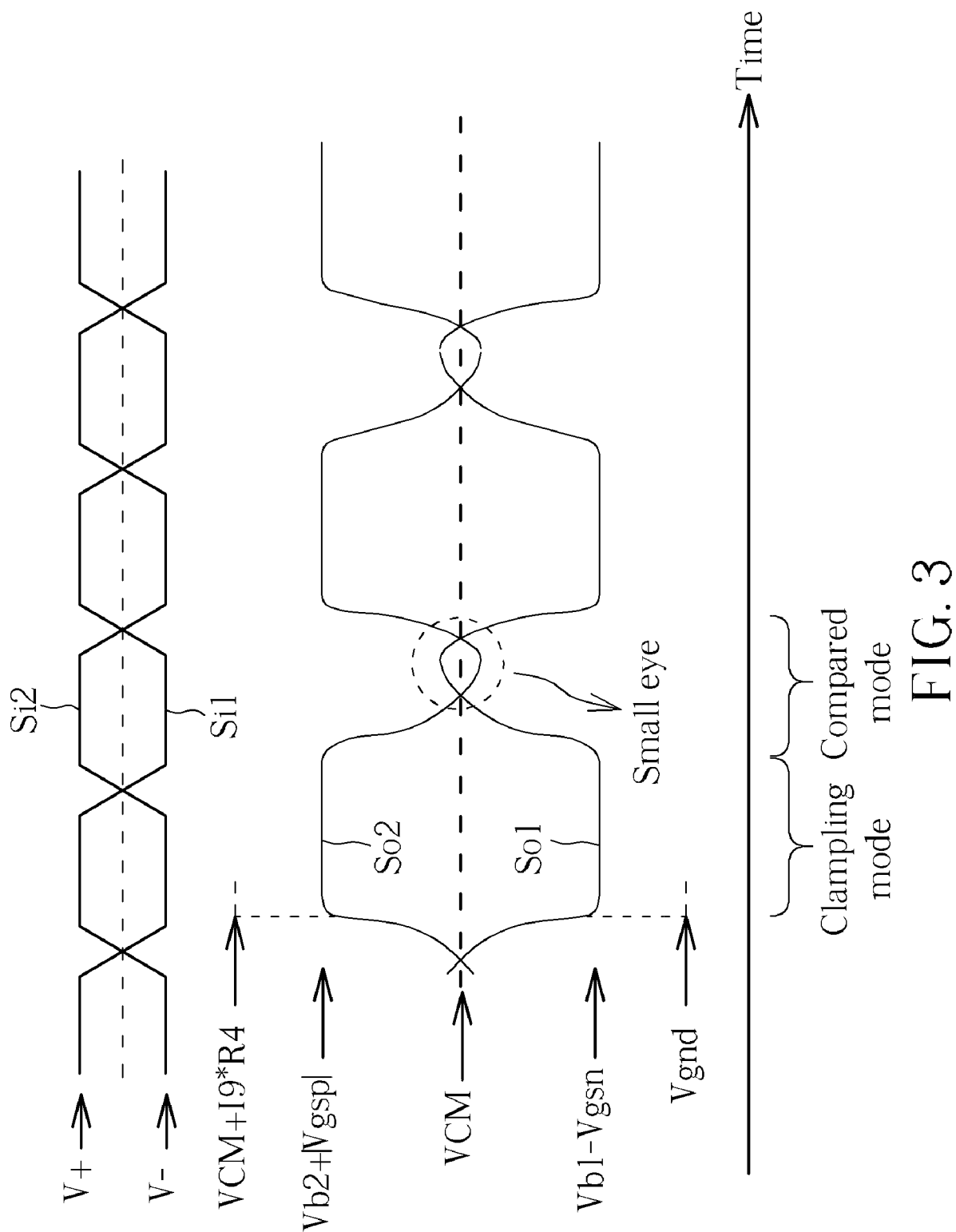
FIG. 3 is a timing diagram illustrating a first input signal, a second input signal, a first output signal, and a second output signal of the embodiment as shown in FIG. 2.

Please refer to FIG. 3. FIG. 3 is a timing diagram illustrating the first input signal Si2, the second input signal Si2, the first output signal So1, and the second output signal So2 of the embodiment as shown in FIG. 2. Since the first input signal Si1 and the second input signal Si2 are differential signals, the first output signal So1 and the second output signal So2 are outputted as a differential output having a common mode voltage VCM. Please note that operating circuit 200 operates under a compared mode and a clamping mode according to the embodiment of the present invention as shown in FIG. 3. In general, the compared mode is defined as when the first input signal Si1 has lower voltage level than the second input signal Si2, and the clamping mode is defined as when the first input signal Si1 has higher voltage level than the second input signal Si2.

Please refer to FIG. 2 in conjunction with FIG. 3. The PMOS transistor M6 and a PMOS transistor M7, which are biased at the bias voltages of 825 mV and 700 mV, respectively, continuously generate the first offset current I1 and the second offset current I2 to the NMOS transistor M3 and the NMOS transistor M4, respectively. During the clamping mode, the first input signal Si1 and the second input signal Si2 respectively induce a current I7 and a current I8 to the NMOS transistor M3 and the NMOS transistor M4 in which current I8 is larger than current I7. Therefore, a sum of currents I2 and I8 is larger than the sum of current I1 and current I7. Therefore, the voltage level of the second output signal So2 will be higher than the voltage level of the first output signal So1, which consequently induces a current I9 to flow from the second output node No2 to the first output node No1 via the resistors R3, R4. Accordingly, the voltage difference between the second output node No2 and the first output node No1 becomes larger and finally turns on the PMOS transistor M10 and the NMOS transistor M9. When the PMOS transistor M10 and the NMOS transistor M9 are turned on, the PMOS transistor M10 will clamp the voltage level at the second output node No2 at approximately Vb2+|Vgsp|, and the NMOS transistor M9 will clamp the voltage level at the first output node No1 at approximately Vb1−Vgsn, wherein

|Vgsp| is a voltage drop between the gate and the source terminals of the PMOS transistor M10 and Vgsn is the voltage drop between the gate and the source terminals of the NMOS transistor M9. In other words, without the PMOS transistor M10 and the NMOS transistor M9, the voltage level at the second output node No2 would increase to VCM+I9*R4, and the voltage level at the first output node No1 would decrease to Vgnd as shown in FIG. 2. Therefore, the voltage difference between the second output signal So2 and the first output signal So1 is clamped to Vb2+|Vgsp|−(Vb1−Vgsn) from VCM+I9*R4−Vgnd during the clamping mode. Then, the operating circuit 200 has a faster switching speed to enter the compared mode from to the clamping mode when the voltage difference is smaller.

During the compared mode, the voltage level of the first input signal Si1 decreases gradually to reach the lowest voltage level V−, and the voltage level of the second input signal Si2 increases gradually to reach the highest voltage level V+. Since the PMOS transistor M6 biased at 825 mV is coupled to the first output node No1 and the PMOS transistor M7 biased at 700 mV is coupled to the second output node No2, the first output signal So1 remains at Vb1−Vgsn and the second output signal So2 remains at Vb2+|Vgsp| until the voltage level of the first input signal Si1 decreases to reach 700 mV and the voltage level of the second input signal Si2 increases to reach 825 mV. When the voltage level of the first output signal So1 reaches 700 mV and the voltage level of the second input signal Si2 reaches 825 mV, the first output signal So1 starts to increase gradually and the second output signal So2 starts to decrease gradually. According to an embodiment of the present invention, when the voltage difference between the lowest voltage level V− of the first input signal Si1 and the highest voltage level V+ of the second input signal Si2 is larger than 125 mV during the compared mode, the first output signal So1 and the second output signal So2 will cross the common mode voltage VCM to generate a small eye as shown in the FIG. 3. Otherwise, if the voltage difference between the lowest voltage level V− of the first input signal Si1 and the highest voltage level V+ of the second input signal Si2 is smaller than 125 mV during the compared mode, the first output signal So1 and the second output signal So2 will not cross the common mode voltage VCM and no small eye can be generated. Therefore, the voltage difference between the first input signal Si1 and the second input signal Si2 (i.e., an eye diagram voltage difference) can be detected by the following circuit blocks as mentioned in the prior art segment and the detailed description is omitted here for brevity. In other words, in this embodiment, when the voltage difference between the first input signal Si1 and the second input signal Si2 is larger than 125 mV during the compared mode, the operating circuit 200 generates the eye diagram to show that the differential signal (i.e., comprises of the first input signal Si1 and the second input signal Si2) at the compared mode is a valid data; otherwise, the differential signal is not a valid data.

Please refer to FIG. 2 again, where the first bias voltage Vb1 and a second bias voltage Vb2 that generated by the bias voltage generator 210 are depend on the common mode voltage VCM. Furthermore, the resistance values of the resistors R3, R4 are designed to make sure the current flowing through the NMOS transistor M9 is equal to the current flowing through the PMOS transistor M10 during the clamping mode. Please note that the reference current I5 is equal to the reference current I6 in this embodiment, but this is not a limitation of the present invention.

Briefly, by utilizing the PMOS transistor M10 and the NMOS transistor M9 to clamp the voltage difference between the second output signal So2 and the first output signal So1 into Vb2+|Vgsp|−(Vb1−Vgsn) from VCM+I9*R4−Vgnd during the clamping mode can increase the eye diagram detecting rate of the operating circuit 200. Please note that the present invention is not limited to coupling the PMOS transistor M10 to the second output node No2 and coupling the NMOS transistor M9 to the first output node No1 at the same time: coupling either one of the PMOS transistor M10 to the second output node No2 or the NMOS transistor M9 to the first output node No1 also belongs within the scope of the present invention.

Figure 4:
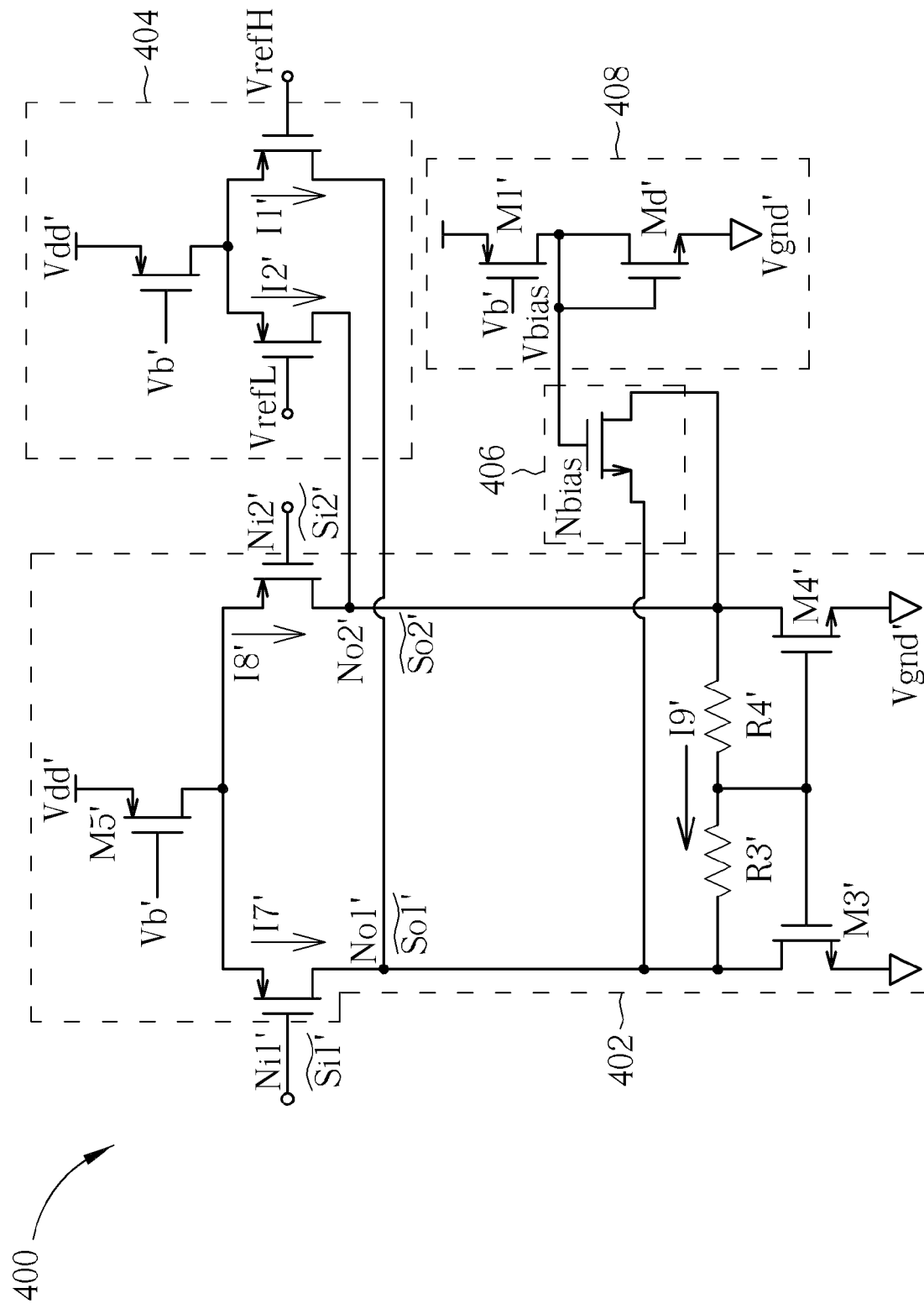
FIG. 4 is a diagram illustrating the operating circuit according to a second embodiment of the present invention.

Please refer to FIG. 4. FIG. 4 is an operating circuit 400 according to a second embodiment of the present invention. The operating circuit 400 comprises a differential amplifier stage 402, an offset current stage 404, a clamping NMOS transistor 406, and a bias voltage generator 408. Similar to the first embodiment as shown in FIG. 2, the differential amplifier stage 402 is utilized for amplifying a differential input to generate a differential output, the differential amplifier stage 402 has a first input node Ni1' for receiving a first input signal Si1' of the differential input, a second input node Ni2' for receiving a second input signal Si2' of the differential input, a first output node No1' for outputting a first output signal So1' of the differential output, and a second output node No2' for outputting a second output signal So2' of the differential output. The offset current stage 404 is coupled to the first output node So1' and the second output node So2' for inducing a first offset current I1' at the first output node No1' and a second offset current I2' at the second output node No2', wherein a current value of the first offset current I1' is different from a current value of the second offset current I2'. The clamping NMOS transistor 406 has a gate node Nbias coupled to a bias voltage Vbias, a source node coupled to the first output node No1', and a drain node coupled to the second output node No2', the clamping NMOS transistor 406 selectively clamping output voltages at the first output node No1' and the second output node No2' according to the first output signal So1' at the first output node No1' and the second output signal So2' at the second output node No2', wherein only one clamping transistor is coupled between the first output node No1' and the second output node No2'. Furthermore, the operating circuit 400 further comprises a bias voltage generator 408. The bias voltage generator 408 comprises a diode-connected NMOS transistor Md' and a PMOS transistor M1', in which a gate node of the diode-connected NMOS transistor Md' coupled to a drain node of a PMOS transistor M1', and a source node of the PMOS transistor M1' coupled to a supply voltage Vdd'. Furthermore, the gate node of the diode-connected NMOS transistor Md' is coupled to the node Nbias for providing the bias voltage Vbias to the clamping NMOS transistor 406. The PMOS transistor M1' generates a reference current Ir1 for the diode-connected NMOS transistor Md' according to a bias voltage Vb', in which the bias voltage Vb' can be a bias voltage of a PMOS transistor M5' in the differential amplifier stage 402 as shown in FIG. 4.

Please note that since the differential amplifier stage 402 and the offset current stage 404 are similar to the differential amplifier stage 202 and the offset current stage 204, respectively, the detailed description of the differential amplifier stage 402 and the offset current stage 404 is omitted here for brevity. Thus, the following description of the operating circuit 400 is focused on the clamping NMOS transistor 406 and the bias voltage generator 408. During the clamping mode, the first input signal Si1' and the second input signal Si2' induce a current I7' and a current I8' to a NMOS transistor M3' and the NMOS transistor M4', respectively, in which the current I8' is larger that the current I7'. Therefore, the voltage level of the second output signal So2' will be higher than the voltage level of the first output signal So1', which consequently induces a current I9' to flow from the second output node No2' to the first output node No1' via the resistors R3', R4'. Accordingly, the voltage difference between the gate node No2' and the first output node No1' becomes larger and finally turns on the clamping NMOS transistor 406, i.e., when the voltage difference is higher than the threshold voltage Vthn of the clamping NMOS transistor 406. When the clamping NMOS transistor 406 is turned on, the clamping NMOS transistor 406 clamps the voltage between the second output node No2' and the first output node No1' into a voltage Vds, wherein the voltage Vds is a drain-source voltage of the clamping NMOS transistor 406. Therefore, the voltage difference between the second output signal So2' and the first output signal So1' is clamped to the voltage Vds during the clamping mode. Thus, the operating circuit 400 has a faster switching speed to enter the compared mode from to the clamping mode when the voltage difference is smaller. Please note that since the compared mode of the operating circuit 400 is similar to the compared mode of the operating circuit 200, the detailed description is omitted here for brevity.

Please note that according to the second embodiment of the present invention, the bias voltage Vbias that is generated by the bias voltage generator 408 is designed to prevent the clamping NMOS transistor 406 from turning on during the compared mode. If the bias voltage Vbias is set to equal to a common mode voltage VCM of the first output signal So1' and the second output signal So2', then the differential voltage of the small eye formed by the first output signal So1' and the second output signal So2' under the compared mode will be ranged between the voltage Vds, wherein the Vds is the drain-source voltage of the NMOS transistor 406 under the clamping mode. In other words, if the small eye's differential swing is smaller than the voltage Vds, then NMOS transistor 406 will not be turned on. Therefore, the present invention is not limited to the bias voltage generator 408: any type of bias voltage generator that can generate the bias voltage Vbias also belongs to the scope of the present invention. Furthermore, one of the preferred embodiments in FIG. 4 is to utilize the high voltage device to implement the operating circuit 400, wherein the high voltage device has a higher threshold voltage.

Figure 5:
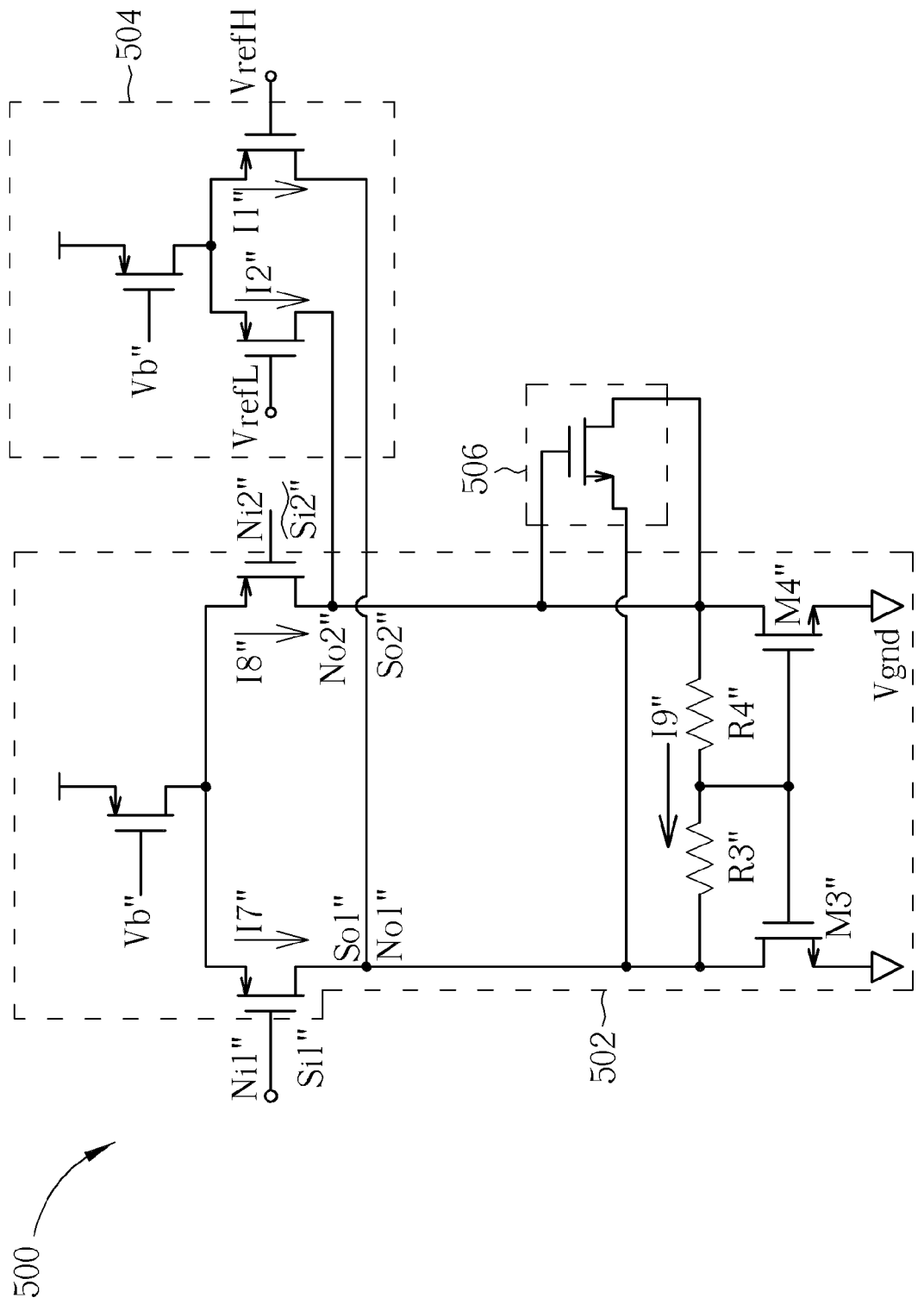
FIG. 5 is a diagram illustrating the operating circuit according to a third embodiment of the present invention.

Please refer to FIG. 5. FIG. 5 is an operating circuit 500 according to a third embodiment of the present invention. The operating circuit 500 comprises a differential amplifier stage 502, an offset current stage 504, and a clamping NMOS transistor 506. Similar to the first embodiment as shown in FIG. 2, the differential amplifier stage 502 is utilized for amplifying a differential input to generate a differential output, the differential amplifier stage 502 has a first input node Ni1" for receiving a first input signal Si1" of the differential input, a second input node Ni2" for receiving a second input signal Si2" of the differential input, a first output node No1" for outputting a first output signal So1" of the differential output, and a second output node No2" for outputting a second output signal So2" of the differential output. The offset current stage 504 is coupled to the first output node So1" and the second output node So2" for inducing a first offset current I1" at the first output node No1" and a second offset current I2" at the second output node No2", wherein a current value of the first offset current I1" is different from a current value of the second offset current I2". The clamping NMOS transistor 506 has a gate node coupled the second output node No2", a source node coupled to the first output node No1", and a drain node coupled to the second output node No2", the clamping NMOS transistor 506 selectively clamping output voltages at the first output node No1" and the second output node No2" according to the first output signal So1" at the first output node No1" and the second output signal So2" at the second output node No2", wherein only one clamping transistor is coupled between the first output node No1" and the second output node No2".

Please note that since the differential amplifier stage 502 and the offset current stage 504 are similar to the differential amplifier stage 202 and the offset current stage 204, respectively, the detailed description of the differential amplifier stage 502 and the offset current stage 504 is omitted here for brevity. Thus, the following description of the operating circuit 500 is focused on the clamping NMOS transistor 506 and the bias voltage generator 508. During the clamping mode, the first input signal Si1" and the second input signal Si2" induce a current I7" and a current I8" to a NMOS transistor M3" and the NMOS transistor M4", respectively, in which the current I8" is larger that the current I7". Therefore, the voltage level of the second output signal So2" will be higher than the voltage level of the first output signal So1", which consequently induce a current I9" to flow from the second output node No2" to the first output node No1" via the resistors R3", R4". Accordingly, the voltage difference between the gate node No2" and the first output node No1" becomes larger and finally turns on the clamping NMOS transistor 506, i.e., when the voltage difference is higher than the threshold voltage Vthn of the clamping NMOS transistor 506. When the clamping NMOS transistor 506 is turned on, the clamping NMOS transistor 506 clamps the voltage between the second output node No2" and the first output node No1" into a voltage Vgs, wherein the voltage Vgs is a drain-source voltage of the clamping NMOS transistor 506. Therefore, the voltage difference between the second output signal So2" and the first output signal So1" is clamped to the voltage Vgs during the clamping mode. Then, the operating circuit 500 has a faster switching speed to enter the compared mode from to the clamping mode when the voltage difference is smaller. Please note that since the compared mode of the operating circuit 500 is similar to the compared mode of the operating circuit 200, the detailed description is omitted here for brevity.

Please note that according to the third embodiment of the present invention, one of the preferred embodiments in FIG. 5 is to utilize the low voltage device to implement the operating circuit 500, wherein the low voltage device has a lower threshold voltage. This is because the body effect will increase the threshold voltage of the clamping NMOS transistor 506.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operating circuit, comprising:
   a differential amplifier stage, for amplifying a differential input to generate a differential output, the differential amplifier stage having a first input node for receiving a first input signal of the differential input, a second input node for receiving a second input signal of the differential input, a first output node for outputting a first output signal of the differential output, and a second output node for outputting a second output signal of the differential output;
   an offset current stage, coupled to the first output node and the second output node, for inducing a first offset current at the first output node and a second offset current at the second output node, wherein a current value of the first offset current is different from a current value of the second offset current; and a first clamping device, coupled to the first output node, for selectively clamping the first output signal at the first output node according to the first output signal at the first output node.

2. The operating circuit of claim 1, further comprising:
a second clamping device, coupled to the second output node, for selectively clamping the second output signal at the second output node according to the second output signal at the second output node.

3. The operating circuit of claim 2, wherein the first clamping device comprises a first transistor having a control node coupled to a first bias voltage, a first node coupled to the first output node, and a second node coupled to a first reference voltage; and the second clamping device comprises a second transistor having a control node coupled to a second bias voltage, a first node coupled to the second output node, and a second node coupled to a second reference voltage that different from the first reference voltage.

4. The operating circuit of claim 3, wherein the differential amplifier stage further includes a common mode voltage node, a voltage at the common mode voltage node is equal to a common mode voltage of the first output signal at the first output node and the second output signal at the second output node, and the operating circuit further comprises:
a bias voltage generator, coupled to the common voltage node, the first transistor and the second transistor, for generating the first bias voltage and the second bias voltage according to the common mode voltage.

5. The operating circuit of claim 4, wherein the bias voltage generator comprises:
an operating amplifier, having a first input node coupled to the common mode voltage node, a second input node coupled to an output node of the operating amplifier;
a first resistor, having a first node coupled to the output node of the operating amplifier, and a second node coupled to the control node of the first transistor and a first reference current; and
a second resistor, having a first node coupled to the output node of the operating amplifier, and a second node coupled to the control node of the second transistor and a second reference current.

6. The operating circuit of claim 1, wherein the first clamping device comprises a first transistor having a control node coupled to a first bias voltage, a first node coupled to the first output node, and a second node coupled to a first reference voltage.

7. An operating circuit, comprising:
a differential amplifier stage, for amplifying a differential input to generate a differential output, the differential amplifier stage having a first input node for receiving a first input signal of the differential input, a second input node for receiving a second input signal of the differential input, a first output node for outputting a first output signal of the differential output, and a second output node for outputting a second output signal of the differential output;
an offset current stage, coupled to the first output node and the second output node, for inducing a first offset current at the first output node and a second offset current at the second output node, wherein a current value of the first offset current is different from a current value of the second offset current; and
a clamping transistor, having a control node coupled to a bias voltage, a first node coupled to the first output node, and a second node coupled to the second output node, the clamping transistor selectively clamping the first output signal at the first output node and the second output signal at the second output node according to the first output signal at the first output node and the second output signal at the second output node, wherein only one clamping transistor is coupled between the first output node and the second output node.

8. The operating circuit of claim 7, further comprising:
a bias voltage generator, comprising:
a diode-connected transistor, having a first node coupled to a reference voltage, and a second node coupled to a control node of the diode-connected transistor and a reference current for providing the bias voltage to the control node of the clamping transistor.

9. The operating circuit of claim 7, wherein the current value of the first offset current is greater than the current value of the second offset current, and the control node of the clamping transistor is coupled to the second output node.

* * * * *

UNITED STATES PATENT AND TRADEMARK OFFICE
CERTIFICATE OF CORRECTION

| | | |
|---|---|---|
| PATENT NO. | : 7,944,247 B2 | Page 1 of 1 |
| APPLICATION NO. | : 12/417641 | |
| DATED | : May 17, 2011 | |
| INVENTOR(S) | : Kun-Hsien Li et al. | |

It is certified that error appears in the above-identified patent and that said Letters Patent is hereby corrected as shown below:

On the title page, item (75), correct the residence of the fourth inventor from "Taipei County" to -- Taipei City --.

Signed and Sealed this
Twelfth Day of July, 2011

David J. Kappos
*Director of the United States Patent and Trademark Office*